United States Patent [19]

Ohnishi et al.

[11] 4,058,754

[45] Nov. 15, 1977

[54] MALFUNCTION INDICATION APPARATUS FOR USE IN A CRT DEFLECTION CIRCUIT

[75] Inventors: Toshinobu Ohnishi, Yokohama; Hiroyuki Sumiya, Fussa; Masao Suzuki, Tokyo, all of Japan

[73] Assignee: Sony Corporation, Tokyo, Japan

[21] Appl. No.: 688,899

[22] Filed: May 21, 1976

[30] Foreign Application Priority Data

June 3, 1975 Japan .................................. 50-66910

[51] Int. Cl.$^2$ ........................................... H01J 29/70
[52] U.S. Cl. .................................... 315/411; 358/190; 358/243
[58] Field of Search ............... 315/387, 399, 411, 370; 358/243, 190

[56] References Cited

U.S. PATENT DOCUMENTS 3,885,201  5/1975  Fernsler ............................... 315/411

*Primary Examiner*—T.H. Tubbesing
*Assistant Examiner*—T. M. Blum
*Attorney, Agent, or Firm*—Lewis H. Eslinger; Alvin Sinderbrand

[57] ABSTRACT

Apparatus for detecting an error condition in a deflection circuit of a cathode ray tube, the deflection circuit being of the type wherein a periodic retrace signal is generated, including a filter coupled to the retrace signal generator and normally non-responsive to the retrace signal. In the event of an error condition, the retrace signal is provided with higher frequency components which are transmitted by the filter. An output signal generator is coupled to the filter to produce an output signal in response to the signal components transmitted by the filter. In one embodiment, the deflection circuit is the horizontal deflection circuit of a CRT wherein the retrace signal is used to produce the high voltage for the CRT. In this embodiment, the output signal is used to vary the repetition frequency of the horizontal oscillating signal applied to the deflection circuit so as to correspondingly change the amplitude of the retrace signal and, thus, to reduce the magnitude of the high voltage.

12 Claims, 5 Drawing Figures

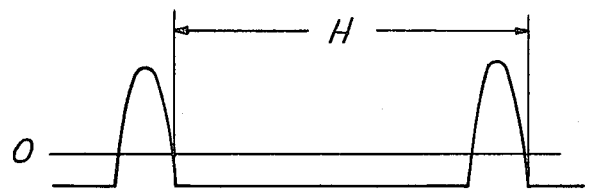
FIG. IA
FIG. IB
FIG. IC

MALFUNCTION INDICATION APPARATUS FOR USE IN A CRT DEFLECTION CIRCUIT

BACKGROUND OF THE INVENTION

This invention relates to apparatus for use in the deflection circuit of a cathode ray tube (CRT) and, more particularly, to apparatus for indicating the occurrence of an error condition in the horizontal deflection circuit, the error condition being of the type which may cause excessive high voltage to be generated from the retrace signal produced by the horizontal deflection circuit.

As is conventional, the high voltage which must be applied to the anode of a CRT is derived from the signals produced by a deflection circuit, such as the horizontal deflection circuit, normally used for deflecting the electron beam. In a typical horizontal deflection circuit, a generally sawtooth-shaped deflecting current, known as the trace signal, is produced by a horizontal output transformer. The repetition frequency and period of this trace signal is determined by a horizontal oscillator which supplies horizontal line rate switching pulses to an electronic switch coupled to the horizontal output transformer. As is also typical, a capacitor is coupled to the horizontal output transformer such that the LC circuit formed by the horizontal output transformer and capacitor has a resonant frequency determinative of the retrace signal period. Hence, when the electronic switch included in the horizontal deflection circuit is turned off, the energy stored in the horizontal output transformer tends to oscillate at the resonant frequency determined by the LC circuit. However, because of the damper diode normally included in the horizontal deflection circuit, the retrace current is permitted to oscillate for only one-half cycle. At the conclusion of this one-half cycle, current flows through the damper diode and the horizontal output transformer to initiate the next trace period.

The retrace current through the horizontal output transformer produces a voltage pulse which is coupled to the secondary coil and then, through the conventional high voltage rectifying circuit, supplies the high anode voltage for the CRT. As one example thereof, in a color cathode ray tube, this voltage pulse, known as the flyback pulse, is used to supply an anode voltage of approximately 25kV.

It has been found that an excessive high anode voltage may be produced in the event of a malfunction in the horizontal deflection circuit. For example, if the capacitor coupled to the horizontal output transformer is, for some reason, disconnected therefrom, then the LC resonant frequency will increase to a very high value. This is because the effective capacitance now connected to the horizontal output transformer is the stray capacitance between the turns of the transformer. Consequently, the flyback pulse will contain correspondingly high frequency components. The high voltage rectifying circuit responds to these higher frequency components to produce the excessive high anode voltage. As a result, the anode voltage may produce a potentially hazardous condition and, if greater than 30-35kV, may generate injurious X-ray radiation.

OBJECTS OF THE INVENTION

Therefore, it is an object of the present invention to provide apparatus for detecting an error condition in the deflection circuit of a CRT.

Another object of this invention is to provide apparatus for preventing the anode voltage of a CRT from reaching excessively high levels.

A further object of this invention is to prevent the generation of injurious X-ray radiation from a television receiver in the event of a malfunction of the horizontal deflection circuit used therewith.

Various other objects, advantages and features of this invention will become apparent from the ensuing detailed description, and the novel features will be particularly pointed out in the appended claims.

SUMMARY OF THE INVENTION

In accordance with this invention, apparatus is provided for detecting an error condition in a deflection circuit of a CRT, the deflection circuit including a retrace signal generator, the apparatus comprising a filter coupled to the retrace signal generator and normally non-responsive to the retrace signal, but transmitting higher frequency components in the retrace signal which are produced in the event of an error condition in the deflection circuit; and an output signal circuit coupled to the filter for producing an output signal in response to the higher frequency components transmitted by the filter.

In one embodiment of this apparatus, the deflection circuit is the horizontal deflection circuit driven by a horizontal oscillating signal, and the output signal is used to change the horizontal oscillating frequency to correspondingly reduce the amplitude of the retrace signal. Hence, the high voltage derived from the retrace signal and supplied to the cathode ray tube anode is prevented from reaching an unacceptably excessive level.

BRIEF DESCRIPTION OF THE DRAWINGS

The following detailed description, given by way of example, will best be understood in conjunction with the accompanying drawings in which:

FIGS. 1A-1C represent waveforms of various signals produced in a deflection circuit for a cathode ray tube;

DETAILED DESCRIPTION OF CERTAIN ONES OF THE PREFERRED EMBODIMENTS

Figure 2:
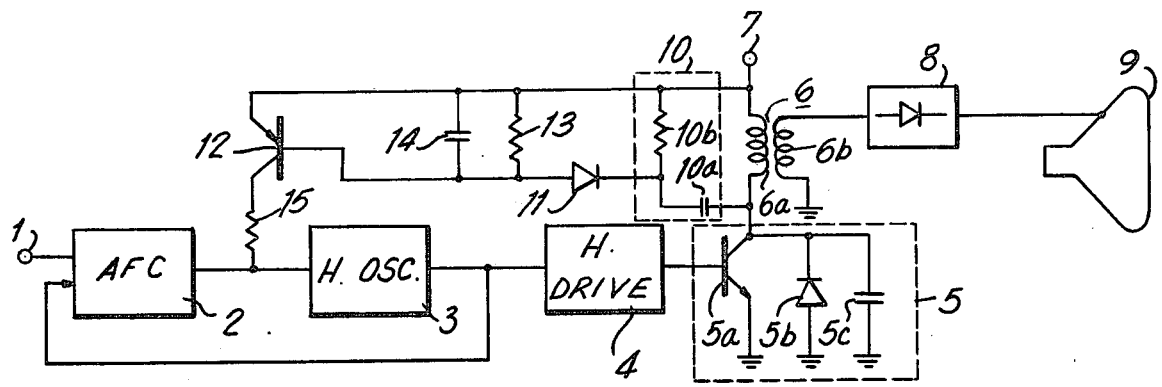
FIG. 2 is a schematic diagram of a cathode ray tube horizontal deflection circuit incorporating apparatus in accordance with the present invention.

Referring now to the drawings, wherein like reference numerals are used throughout, and in particular to FIG. 2, a portion of the horizontal deflection circuit used in a CRT 9 is schematically shown. The horizontal deflection circuit includes an automatic frequency control circuit 2, a variable oscillator 3, a horizontal drive circuit 4 and a horizontal output 5. Automatic frequency control circuit 2 is connected to an input terminal 1 and is adapted to receive a horizontal synchronizing signal from a synchronizing separator circuit (not shown) normally included in a television receiver. Automatic frequency control circuit 2 is coupled to variable oscillator 3 and functions to control the oscillating frequency of oscillator 3 to be equal to the frequency of the received synchronizing signals. Accordingly, oscillator 3 may be a conventional voltage-controlled oscillator whose output is fed back to another input of automatic frequency control circuit 2 for comparison with the received synchronizing signal. As one example thereof, the oscillating frequency of oscillator 3 may be proportional to the control voltage applied thereto such that the oscillating frequency is increased if the control voltage level increases.

The output of oscillator 3 also is connected through horizontal drive circuit 4 to the base electrode of a switching transistor 5a included in horizontal output circuit 5. The collector-emitter circuit of switching transistor 5a is connected in series with the primary winding 6a of a horizontal output, or flyback, transformer 6, this series circuit being connected across a power supply represented by a voltage supply terminal 7 and ground. In addition, a damper diode 5b and a capacitor 5c each are connected in parallel with the collector-emitter circuit of switching transistor 5a.

The secondary coil 6b of flyback transformer 6 is coupled to a high voltage rectifying circuit 8 to produce a sufficiently high voltage to be applied to the anode of CRT 9.

The horizontal deflection circuit thus far described operates in a conventional manner such that at the beginning of a trace period, switching transistor 5a is non-conductive and current flows through the primary winding 6a of flyback transformer 6 and damper diode 5b. This current has a sawtooth waveform and increases from a relatively negative level until damper diode 5b approaches cutoff. At that time, a pulse is applied by oscillator 3 to horizontal drive circuit 4 and then to transistor 5a to turn that transistor on. Hence, trace current continues to flow through primary winding 6a, but now through the conducting transistor. When the pulse produced by oscillator 3 terminates, transistor 5a is rapidly turned off. This causes the current through primary winding 6a to decay at a rapid rate. Hence, $di/dt$ is high. Since the voltage at the collector electrode of transistor 5a can be expressed as $L\ (di/dt)$, a pulse of relatively high amplitude is produced across the primary winding. Because of the connection of capacitor 5c, the LC circuit formed of primary winding 6a and capacitor 5c has a tendency to oscillate at the resonant frequency of this circuit. However, as is known, damper diode 5b permits oscillation for only one-half of a cycle. Thus, the pulse produced across primary winding 6a has a duration substantially equal to one-half cycle of the resonant frequency of this LC circuit.

Thus pulse produced across primary winding 6a is coupled to secondary winding 6b and, because of the AC magnetic coupling characteristics of flyback transformer 6, the pulse across secondary winding 6b has the waveform shown in FIG. 1A. This pulse has a repetition frequency equal to the horizontal line deflection frequency determined by the oscillating frequency of oscillator 3. The area of the pulse signal above the zero-level axis is seen to be equal to the area of the signal below that axis. Since the number of turns of the secondary winding is much greater than the number of turns of the primary winding, the pulse coupled across secondary winding 6b is greater than the pulse produced across primary winding 6a. After rectification of these retrace pulses in high voltage rectifier circuit 8, the resultant high anode voltage is applied to CRT 9.

If there is a malfunction in horizontal output circuit 5 of the type wherein capacitor 5c is disconnected from primary winding 6a, then essentially only the stray capacitance between turns of the primary winding is present. This capacitance is far less then the capacitance of capacitor 5c, resulting in a much higher resonant frequency. Thus, when transistor 5a is turned off to initiate a retrace period, the energy stored in primary winding 6a tends to oscillate at the much higher resonant frequency. Consequently, the voltage at the collector electrode of transistor 5a, which is equal to $L\ (di/dt)$, is much greater than described previously. This, of course, induces a correspondingly higher voltage pulse across secondary winding 6b and applies an excessively high anode voltage to CRT 9 from high voltage rectifier circuit 8. Moreover, because of this higher voltage at the collector electrode of transistor 5a, the transistor is driven into conduction even though no base voltage is applied thereto. Hence, the waveform of the retrace pulse signal across transistor 5a caused by the disconnection of capacitor 5c from primary winding 6a appears as shown in FIG. 1B. As may be observed, this retrace pulse, although provided with a repetition frequency still equal to the horizontal deflection frequency, now includes higher frequency components due to the higher resonant frequency determined by the inductance of primary winding 6a and the stray capacitance associated with this inductance.

The apparatus used to avoid the application of an excessive anode voltage to CRT 9 in the event that capacitor 5c is disconnected from flyback transformer 6 now will be described. Although this apparatus avoids the radiation of injurious X-rays caused by excessively high anode voltage, it should be distinguished from prior art apparatus which is intended to prevent X-ray radiation in the event that the low voltage power supply, such as the power supply connected to terminal 7, increases beyond acceptable limits.

As shown in FIG. 2, a filter circuit 10 is connected across primary winding 6a, the filter circuit being a high-pass filter formed of a capacitor 10a connected in series with a resistor 10b, the output of this filter being derived across resistor 10b. The range of frequencies transmitted by filter 10 is greater than the repetition frequency of normal retrace pulses shown in FIG. 1A. However, higher frequency components, such as the components produced when capacitor 5c is disconnected from flyback transformer 6, are within the frequency transmission range of filter 10. Hence, although shown as a high-pass filter, filter 10 may, alternatively, be a band-pass filter. In either embodiment, it is appreciated that normal retrace pulse shown in FIG. 1A are not passed by filter 10, but retrace pulses having higher frequency components such as shown in FIG. 1B are transmitted by this filter.

The output from filter 10 is rectified by a rectifier 11, such as a diode, and then filtered by the parallel combination of resistor 13 and capacitor 14 to produce a direct voltage indicative of the higher frequency components included in the retrace pulse. A transistor 12, such as a PNP transistor, receives this direct voltage at its base electrode to produce an output signal. The collector-emitter circuit of transistor 12 is connected to power supply terminal 7, thereby to produce an output signal on the order of the power supply voltage. This output signal is applied to voltage-controlled oscillator 3 by a collector resistor 15. Alternatively, the output signal may be applied to other circuitry or devices so as to provide an indication of the malfunction in horizontal output circuit 5.

In operation, it is appreciated that filter 10 detects the higher frequency components in the retrace signal, such as shown in FIG. 1B, these higher frequency components being rectified and filtered and applied to the base electrode of transistor 12 to render the transistor conductive. Hence, the power supply voltage at terminal 7 is applied through transistor 12 and resistor 15 to the input terminal of oscillator 3. This power supply voltage generally is greater than the control voltage applied to oscillator 3 by automatic frequency control circuit 2. Consequently, the oscillating frequency of oscillator 3 is increased due to this higher voltage now applied thereto by transistor 12. Accordingly, the frequency of the drive pulses applied to transistor 5a is increased to correspondingly increase the repetition frequency of the trace and retrace signals generated in horizontal output circuit 5. Therefore, although the voltage across primary winding 6a increases at the same rate as before during the trace period, transistor 5a is turned off before the amount of energy stored in primry winding 6a can reach the same level reached prior to the increase in the oscillating frequency of oscillator 3. Thus, the retrace pulse amplitude across primary winding 6a is reduced and the coupled retrace pulse across secondary winding 6b, shown in FIG. 1C, is less than the coupled retrace pulse amplitude shown in FIG. 1A. Consequently, the anode voltage applied to CRT 9 by high voltage rectifying circuit 8 is reduced below the X-ray radiating level, even though capacitor 5c is disconnected from flyback transformer 6. Thus, it is seen that by increasing the oscillating frequency of oscillator 3 in response to the detection of higher frequency components in the retrace pulse caused by the disconnection of capacitor 5c from flyback transformer 6, the high voltage applied to CRT 9 can be maintained below hazardous levels and thus avoid radiating injurious X-rays as a result thereof.

In the waveform diagram of FIG. 1C, as in FIG. 1A, the coupled retrace pulse is seen to vary about the zero-level axis. That is, because of the AC coupling in flyback transformer 6, the area of the retrace signal waveform above the zero-level axis is substantially equal to the area of the retrace signal waveform below the zero-level axis. Of course, the peak amplitude of the retrace signal is reduced because the higher switching frequency at which transistor 5a is switched in the event of a malfunction in horizontal output circuit 5 does not permit the stored energy level in primary winding 6a, and thus the retrace pulse peak level, to attain the same limit reached when the switching frequency had been less. Also, it is appreciated that, because of the increase in frequency of oscillator 3, the horizontal synchronization of the displayed image on CRT 9 is significantly disturbed. As a result thereof, an observer will perceive that the CRT is operating in an abnormal condition, such as a malfunction, and will take positive action to promptly terminate further operation of the CRT.

Figure 3:
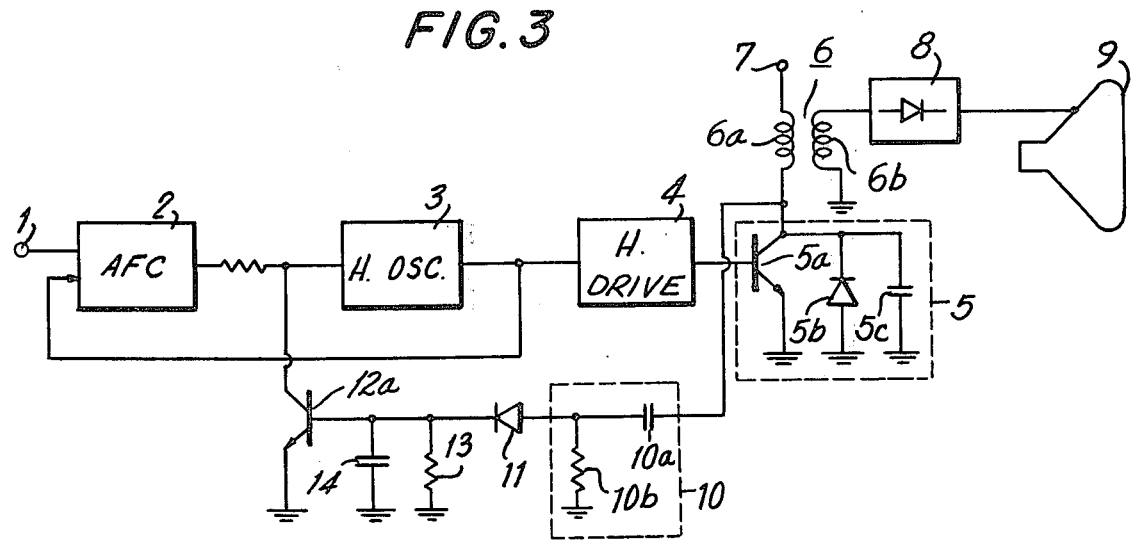
FIG. 3 is a schematic diagram of another embodiment of apparatus in accordance with this invention.

Another embodiment of apparatus in accordance with the present invention is shown in FIG. 3. A comparison between the embodiments of FIGS. 2 and 3 indicates that the FIG. 3 embodiment differs from that described above in that an NPN transistor 12a has its collector-emitter circuit connected in series with a reference potential, such as ground, thereby to apply a relatively lower voltage to the input terminal of oscillator 3 in the event that filter 10 detects higher frequency components in the retrace signal. Although normal retrace pulses are blocked by filter 10 such that transistor 12a is not conductive and oscillator 3 is controlled only by the control voltage produced by automatic frequency control circuit 2, the presence of higher frequency components in the retrace pulse, caused by the disconnection of capacitor 5c from flyback transformer 6, results in a signal sufficient to render transistor 12a conductive and thereby apply ground potential to oscillator 3. Consequently, oscillator 3 is effectively deactuated by this low voltage applied thereto. Hence, transistor 5a is not switched on and off, thereby terminating trace and retrace signals. Accordingly, the electron beam of CRT 9 no longer is deflected. Also, in the absence of retrace pulses, an excessively high anode voltage cannot be applied to the CRT. Also, since an intelligible image no longer will be displayed by CRT 9, an observer will be prompted to take suitable steps to avoid further operation of the CRT apparatus.

While the present invention has been described in conjunction with some preferred embodiments, it should be readily apparent that various changes and modifications in form and details can be made by one of ordinary skill in the art without departing from the spirit and scope of the invention. For example, transistors 12 and 12a can be replaced by other suitable switching devices so as to apply corresponding control voltages to oscillator 3 in the event of an error condition in horizontal output circuit 5. Therefore, it is intended that the appended claims be interpreted to include the foregoing as well as other such changes and modifications.

What is claimed is:

1. Apparatus for detecting an error condition in a deflection circuit of a cathode ray tube, said deflection circuit including means for generating a periodic retrace signal, comprising:
   filter means coupled to said retrace signal generating means and normally non-responsive to said retrace signal, said retrace signal having higher frequency components in the event of said error condition and said filter means passing said higher frequency components; and
   means coupled to said filter means and responsive to signals passed by said filter means to produce an output signal.

2. The apparatus of claim 1 wherein said deflection circuit includes a flyback transformer normally connected to a capacitor to produce said retrace signal, the frequency components in said retrace signal increasing in the event said normal connection is interrupted.

3. The apparatus of claim 2 wherein said flyback transformer normally supplies a high voltage to said cathode ray tube; and further comprising means responsive to said output signal for reducing said high voltage.

4. The apparatus of claim 3 wherein said means for reducing said high voltage comprises means for changing the repetition frequency of said retrace signal.

5. The apparatus of claim 4 wherein said deflection circuit includes switch means coupled to said flyback transformer, and controllable oscillator means coupled to said switch means for supplying a periodic signal thereto determinative of the repetition frequency of trace and retrace signals; and wherein said means for changing the repetition frequency of said retrace signals comprises means for applying said output signal to said oscillator means as a control signal therefor.

6. The apparatus of claim 5 wherein said output signal applying means comprises a transistor; rectifier means for connecting said transistor to said filter means to render said transistor conductive in responsive to signals passed by said filter means; and means for connecting the output of said transistor to said oscillator.

7. The apparatus of claim 6 wherein said output signal applying means further comprises a source of voltage coupled to said transistor, said voltage being applied to said oscillator when said transistor is conductive, thereby to increase the frequency of said periodic signal.

8. The apparatus of claim 6 wherein said output signal applying means further comprises a source of reference potential coupled to said transistor, said reference potential being applied to said oscillator when said transistor is conductive, thereby to deactivate said oscillator and interrupt said periodic signal.

9. In a cathode ray tube, apparatus for limiting the radiation therefrom caused by an excessive high voltage applied to said cathode ray tube in the event of a malfunction of the horizontal deflection circuit used with said cathode ray tube, comprising:

a flyback transformer included in said horizontal deflection circuit for generating a retrace signal, said retrace signal being used to produce said high voltage for said cathode ray tube;

a controllable oscillator coupled to said horizontal deflection circuit for supplying an oscillating signal thereto whose frequency is determinative of the repetition frequency of trace and retrace signals generated in said horizontal deflection circuit;

filter means coupled to said flyback transformer and normally non-responsive to the frequency component of said retrace signal but passing higher frequency components included in said retrace signal in the event of a malfunction of said horizontal deflection circuit; and switch means coupled to said oscillator and responsive to the signals passed by said filter means to apply a control signal to said oscillator for changing the frequency of said oscillating signal and the repetition frequency of said retrace signal, thereby to reduce the amplitude of the retrace signal used to produce said high voltage for said cathode ray tube.

10. The apparatus of claim 9 wherein said switch means comprises a transistor coupled to a voltage source; and rectifier means coupled to said filter means and responsive to said signals passed by said filter means for activating said transistor to supply said voltage to said oscillator.

11. The apparatus of claim 11 wherein the frequency of said oscillating signal increases in response to said voltage.

12. The apparatus of claim 10 wherein said oscillator is deactivated in response to said voltage.

* * * * *